United States Patent [19]
Naito et al.

[11] Patent Number: 5,568,305
[45] Date of Patent: Oct. 22, 1996

[54] HETERODYNE RECEIVER PROVIDED WITH A FREQUENCY DISCRIMINATOR FOR COHERENT LIGHTWAVE COMMUNICATIONS

[75] Inventors: Takao Naito; Terumi Chikama; Hiroshi Onaka, all of Kawasaki, Japan

[73] Assignee: Fujitsu Limited, Japan

[21] Appl. No.: 462,565

[22] Filed: Jun. 5, 1995

Related U.S. Application Data

[63] Continuation of Ser. No. 355,339, Dec. 12, 1994, abandoned, which is a continuation of Ser. No. 900,493, Jun. 18, 1992, abandoned.

[30] Foreign Application Priority Data

Jun. 20, 1991 [JP] Japan ..................... 3-148823

[51] Int. Cl.⁶ .................................. H04B 10/06
[52] U.S. Cl. ..................... 359/191; 359/194; 329/325; 329/315; 455/214; 455/234.1
[58] Field of Search ..................... 359/191, 189, 359/190, 194; 329/325, 315, 318, 319, 323; 455/213, 214, 234.1

[56] References Cited

U.S. PATENT DOCUMENTS

| 3,482,099 | 12/1969 | Goodwin . | |
| 3,696,298 | 10/1972 | Kahn . | |
| 3,795,447 | 3/1974 | Welch et al. | 356/28 |
| 3,909,725 | 9/1975 | Baghdady | 325/347 |
| 4,321,706 | 3/1982 | Craft . | |
| 4,644,297 | 2/1987 | Olds . | |
| 4,656,432 | 4/1987 | Matsumura | 455/214 |
| 4,672,636 | 6/1987 | Marshall et al. | 329/325 |
| 5,023,950 | 6/1991 | Tsushima et al. | 359/191 |
| 5,144,467 | 9/1992 | Kitajima et al. | 359/189 |
| 5,274,490 | 12/1993 | Tsushima et al. | 359/191 |
| 5,396,361 | 3/1995 | Sasaki et al. | 359/189 |

FOREIGN PATENT DOCUMENTS

| 56-150734 | 11/1981 | Japan . |
| 2144004 | 2/1985 | United Kingdom . |

OTHER PUBLICATIONS

Electronic Engineer's Reference Book, 6th Edition, Edited By FF Mazda Chapter 34, pp. 10–11.

Primary Examiner—Hezron E. Williams
Assistant Examiner—Richard A. Moller
Attorney, Agent, or Firm—Staas & Halsey

[57] ABSTRACT

A heterodyne receiver including a frequency discriminator adapted such that a signal to be subjected to frequency discrimination is divided into two signals and mixed together after one of the divided signals has been given a delay time, and additionally provided with a filter, of which a cutoff frequency is determined according to the delay time, disposed in the front stage. This results in both improvement of accuracy in frequency identification and expansion of the capture range.

14 Claims, 11 Drawing Sheets

FIG. I
(PRIOR ART)
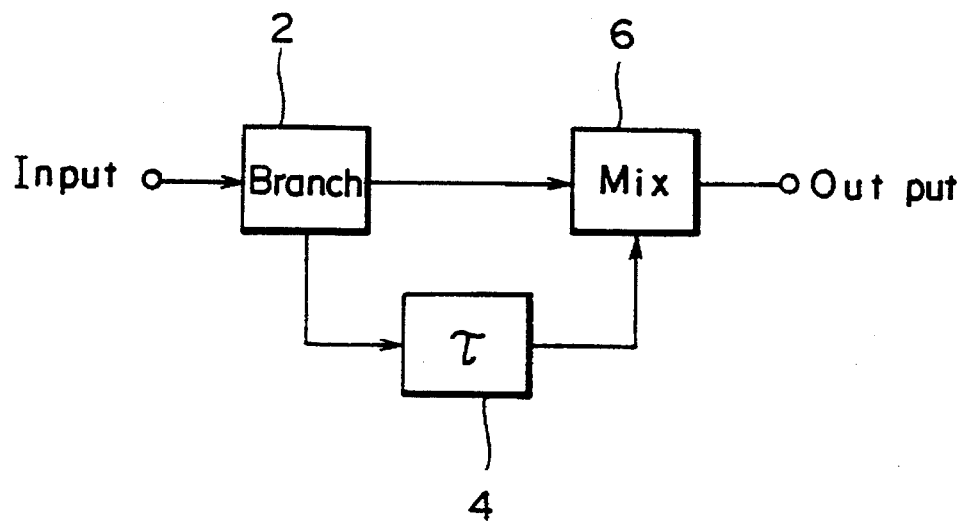
FIG. 2
(PRIOR ART)
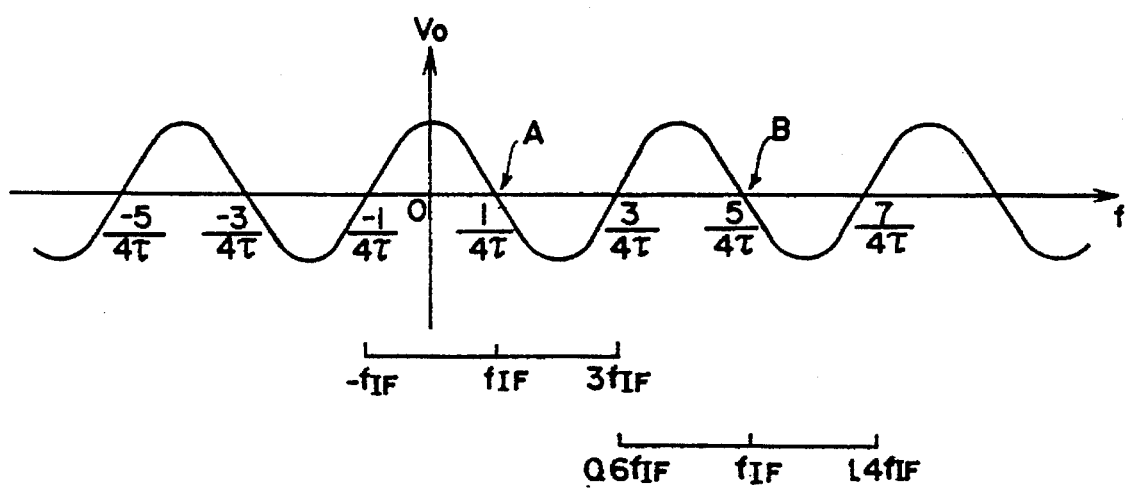

5,568,305

HETERODYNE RECEIVER PROVIDED WITH A FREQUENCY DISCRIMINATOR FOR COHERENT LIGHTWAVE COMMUNICATIONS

This application is a continuation of application Ser. No. 08/355,339, filed Dec. 12, 1994, abandoned, which is a continuation of application Ser. No. 07/900,493, filed Jun. 18, 1992, now abandoned.

BACKGROUND OF THE INVENTION

1. Field of the Invention

The present invention generally relates to a frequency discriminator for converting an input signal to a DC voltage or a DC current at the level corresponding to the frequency or average frequency of the input signal and, more particularly, to a frequency discriminator having high accuracy in frequency identification and a wide capture range. The invention further relates to application of the frequency discriminator to a heterodyne receiver for coherent lightwave communications.

2. Description of the Related Art

The coherent lightwave communications system has improved reception sensitivity by 10 to 20 dB over conventional intensity modulation/direct detection (IM/DD) and facilitates optical frequency-division multiplex. Therefore, the system is expected to be put to practical use in high speed and long distance transmission. In the heterodyne receiver for coherent lightwave communications, a local light beam is mixed with a signal light beam received and the mixed light beams are optically detected by a photodiode having a square-law detection characteristic and thereby an intermediate-frequency signal is obtained. The intermediate-frequency signal is demodulated to a baseband signal. Since the frequency of the intermediate-frequency signal corresponds to the difference between the frequency of the signal light and the frequency of the local light, if the center frequency of the signal light and/or the local light is varied by changes in ambient conditions or the like, the center frequency of the intermediate-frequency signal is also varied. A variation in the center frequency of the intermediate-frequency signal hinders normal demodulation. Therefore, in the heterodyne receiver, automatic frequency control (AFC) is generally performed to keep the center frequency of the intermediate-frequency signal constant.

In practicing AFC, a frequency discriminator is used. The frequency discriminator applied to AFC in the heterodyne receiver converts the input intermediate-frequency signal to a DC voltage at the level corresponding to the center frequency of the input intermediate-frequency signal and outputs the DC voltage. Frequency discriminators of the described type are required to have the following characteristics:

(A) That accuracy in frequency identification is high. In other words, that the output voltage level greatly varies with a change in the frequency. As the accuracy in frequency identification is increased, frequency stability in the automatic frequency control is improved.

(B) That the range of frequencies for which automatic frequency control can be achieved by a control loop (capture range) is wide.

There has so far been known a frequency discriminator, in which it is adapted such that an input signal to be subjected to frequency discrimination is divided into two signals, one of the divided signals is given a predetermined delay time, and this signal is mixed with the other of the divided signals and the mixed signal is output.

In such prior art frequency discriminator, there exists a trade-off between improvement of the accuracy in the frequency identification and expansion of the capture range, namely, it is impossible to satisfy both requirements at the same time.

SUMMARY OF THE INVENTION

Accordingly, an object of the present invention is to provide a frequency discriminator with both high accuracy in frequency identification and a wide capture range.

Another object of the present invention is to provide a high-performance heterodyne receiver for coherent lightwave communications using the frequency discriminator.

According to an aspect of the present invention there is provided a frequency discriminator comprising a delay circuit giving an input signal a predetermined delay time $\tau$ and outputting the delayed signal; a filter supplied with a signal to be subjected to frequency discrimination, the cutoff frequency of the filter being set up according to the delay time $\tau$; a branch circuit dividing an input signal into two signals and outputting the divided signals, the input port of the branch circuit being operatively connected with the output port of the filter and a first output port of the branch circuit being operatively connected with the input port of the delay circuit; and a mixer operatively connected with a second output port of the branch circuit and the output port of the delay circuit for mixing the signal from the branch circuit and the signal from the delay circuit.

According to another aspect of the present invention, there is provided a heterodyne receiver for coherent lightwave communications comprising: a variable-frequency local light source; an optical coupler for mixing an incoming signal light beam and a local light beam from the local light source and outputting the mixed signal; an optical detection circuit for photoelectrically converting the mixed signal from the optical coupler of the signal light beam and local light beam; a demodulator for reproducing transmitted data from an intermediate-frequency signal obtained by detection in the optical detection circuit; a frequency discriminator supplied with the intermediate-frequency signal from the optical detection circuit; and an automatic frequency control circuit for controlling the frequency of the local light beam such that the output level of the frequency discriminator is kept constant; the frequency discriminator including: a delay circuit giving an input signal a predetermined delay time $\tau$ and outputting the delayed signal; a filter supplied with a signal to be subjected to frequency discrimination, the cutoff frequency of the filter being set up according to the delay time $\tau$; a branch circuit dividing an input signal into two signals and outputting the divided signals, the input port of the branch circuit being operatively connected with the output port of the filter and a first output port of the branch circuit being operatively connected with the input port of the delay circuit; and a mixer operatively connected with a second output port of the branch circuit and the output port of the delay circuit for mixing the signal from the branch circuit and the signal from the delay circuit.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 1 is a block diagram showing a prior art example of frequency discriminator;

FIG. 2 is a graph showing a frequency discrimination characteristic of the frequency discriminator shown in FIG. 1;

DETAILED DESCRIPTION OF THE PREFERRED EMBODIMENTS

Figure 3:
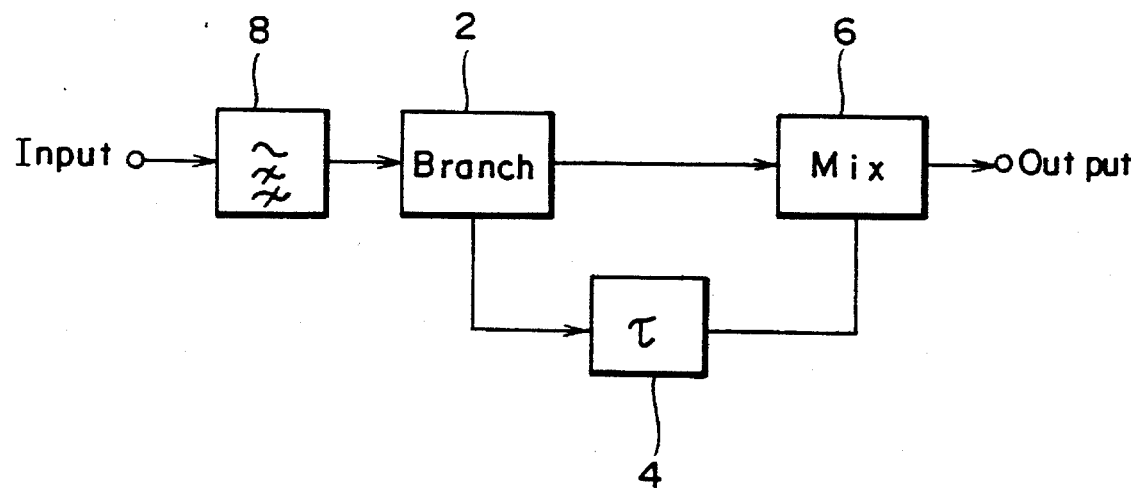
FIG. 3 is a block diagram showing a first embodiment of the frequency discriminator according to the present invention.

In understanding the embodiment of the present invention, it is considered helpful to understand structure and operation of a prior art frequency discriminator, and therefore explanation of the same will be made first. FIG. 1 is a block diagram showing an example of a prior art frequency discriminator. The frequency discriminator comprises a branch circuit 2 for dividing a signal such as an intermediate-frequency signal to be subjected to frequency discrimination, a delay circuit 4 for giving a predetermined delay of time τ to one of the signals divided by the branch circuit 2 and outputting the delayed signal, and a mixer 6 for mixing the output signal from the delay circuit 4 and the other of the divided signals by the branch circuit 2 and outputting the mixed signal.

When the signal input to the frequency discriminator is expressed as $\cos 2\pi ft$ (f: frequency, t: time), the output voltage $V_0$ of the frequency discriminator is expressed as $$V_0 = \cos 2\pi ft \cdot \cos 2\pi f(t-\tau) \quad (1)$$
$$= (1/2)\cos 2\pi f\tau + (1/2)\cos 2\pi f(2t-\tau)$$

By extracting the DC component corresponding to the first term of the right side using a suitable low-pass filter, a frequency discrimination characteristic as shown in FIG. 2 can be obtained. Referring to the graph shown in FIG. 2, the axis of ordinates represents the output voltage of the frequency discriminator and the axis of abscissas represents the frequency. The reason why there is shown a region in which the frequency is negative is that we are considering the frequency of the intermediate-frequency signal as the frequency in question and that the frequency of the intermediate-frequency signal can take on both positive values (real) and negative values (image) depending on which is the larger of the frequency of the signal light and the frequency of the local light.

In the operation of an AFC with the use of the frequency discriminator having a frequency discrimination characteristic as shown in FIG. 2, when the output voltage of the frequency discriminator is positive, the frequency of the local light is varied in the direction to increase the center frequency of the intermediate-frequency signal, whereas, when the output voltage of the frequency discriminator is negative, the frequency of the local light is varied in the direction to decrease the center frequency of the intermediate-frequency signal. As a result, the center frequency of the intermediate-frequency signal is converged on the point where the output voltage level of the frequency discriminator becomes zero. If the center frequency of the intermediate-frequency signal is within the capture range, one frequency stabilization point can be obtained. When the center frequency of an intermediate-frequency signal is outside the capture range, the stabilization point is obtained at a point where the frequency is higher or lower than that in the desired frequency stabilization point.

To be concrete, denoting the center frequency of an intermediate-frequency signal by $f_{IF}$, the center frequency $f_{IF}$ is stabilized so as to satisfy this expression $$f_{IF}=(2n+1)/4\tau(n=0, 1, 2, \ldots). \quad (2)$$

Conversely speaking, the delay time τ is set up according to the frequency to be stabilized, such that the expression (2) is satisfied.

In order to widen the capture range in the frequency discriminator shown in FIG. 1, it is advantageous to decrease the value of n in the expression (2) and reduce the delay time τ, accordingly. For example, when the center frequency $f_{IF}$ of an intermediate-frequency signal is set up at the point A where the frequency becomes ¼τ in FIG. 2, AFC is possible over the range from $-f_{IF}$ to 3 $f_{IF}$ and the capture range becomes 4 $f_{IF}$. However, there is a problem in this case that the variation of the output voltage for a unit of change in the frequency is small and, hence, the accuracy in frequency identification is low.

On the other hand, in order to increase the accuracy in frequency identification, it is preferable to increase the value of n in the expression (2) and increase the value of τ, accordingly. For example, the center frequency $f_{IF}$ of the intermediate-frequency signal may be stabilized at the point B where the frequency becomes ⁵⁄₄τ in FIG. 2. Then, the variation of the output voltage for a unit of change in the frequency becomes considerably large and the accuracy in frequency identification is increased, but the range over which AFC is possible becomes that from 0.6 $f_{IF}$ to 1.4 $f_{IF}$ and, hence, the capture range becomes as narrow as 0.8 $f_{IF}$.

According to the prior art as described above, it has been necessary to make a choice between a wide capture range, while allowing the accuracy in frequency identification to be low, and high accuracy in frequency identification, while allowing the capture range to be narrow.

Now, some of the embodiments of the present invention will be described below in detail with reference to the accompanying drawings. Throughout the drawings, parts substantially the same are denoted by the same reference characters.

FIG. 8 is a block diagram showing a first embodiment of the frequency discriminator of the present invention. Reference numeral 8 denotes a high-pass filter having a predetermined cutoff frequency $f_{HPF}$, and a signal to be subjected to frequency discrimination is input to this high-pass filter 8. Reference numeral 2 denotes a branch circuit for dividing the signal passed through the high-pass filter 8. The branch circuit 2 is formed for example of a 3-dB coupler. Reference numeral 4 denotes a delay circuit to which one of the divided signals by the branch circuit 2 is input, and this delay circuit 4 gives a predetermined delay time τ to the input signal and outputs the delayed signal. Reference numeral 6 denotes a mixer in which the output signal from the delay circuit 4 and the other of the signals divided by the branch circuit 2 are input, and the mixer 6 mixes the input two signals and outputs the mixed signal. The signal to be subjected to frequency discrimination is for example an intermediate-frequency signal including modulated components obtained by heterodyne detection in coherent lightwave communications.

Figure 4A:
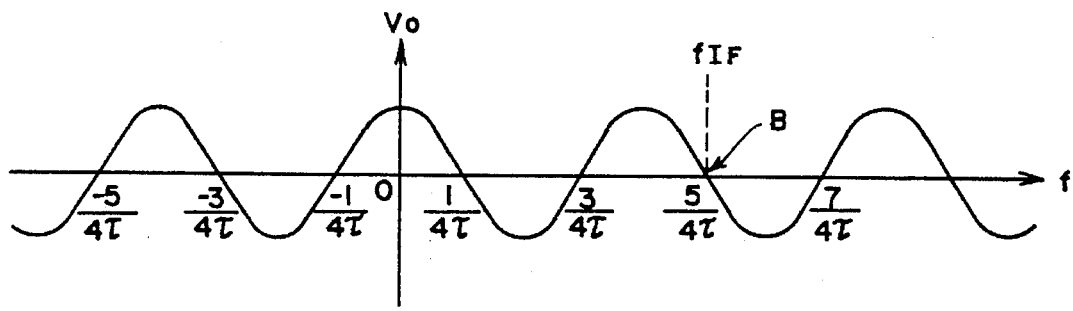
FIG. 4A, FIG. 4B, and FIG. 4C are drawings explanatory of characteristics of the frequency discriminator shown in FIG. 3.
Figure 4B:
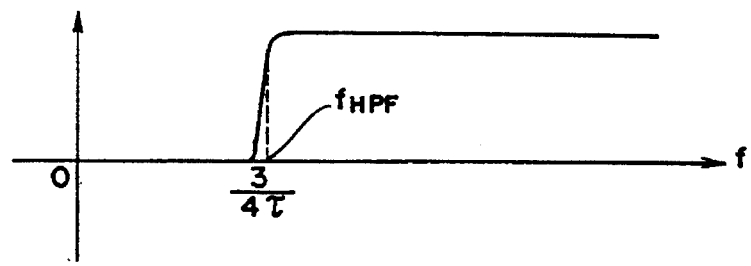

FIG. 4A is a graph showing a frequency discrimination characteristic when there is provided no high-pass filter 8. In this case, the center frequency $f_{IF}$ of the intermediate-frequency signal and the delay time τ can be set up to satisfy the expression (2) the same as in the prior art. When n is set such that n=0, however, the identification accuracy cannot be improved as described above, in embodying this invention, it is preferable that n is a natural number. When performing AFC such that the center frequency $f_{IF}$ of the intermediate-frequency signal is stabilized at the point B in the frequency discrimination characteristic, n becomes n=2. When n=2, the cutoff frequency $f_{HPF}$ of the high-pass filter 8 is set up such that $f_{HPF}=3/4\tau$ as shown in FIG. 4B. Generally speaking, the cutoff frequency $f_{HPF}$ is set up to satisfy $$f_{HPF}=(2n-1)/4\tau \qquad (3)$$

under the condition given by the expression (2).

Figure 4C:
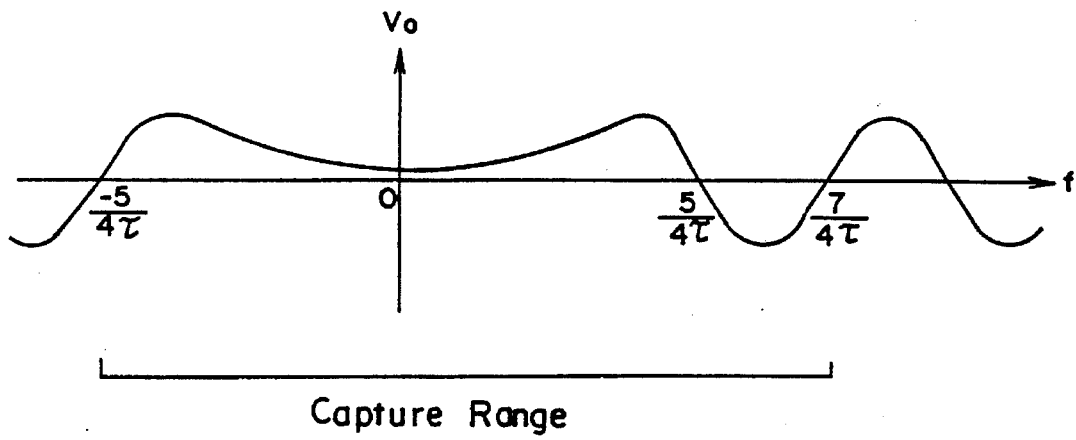

FIG. 4C is a graph showing a frequency discrimination characteristic in the frequency discriminator of FIG. 3 with a high-pass filter 8 added thereto. The upper limit of the capture range is 7/4τ the same as the case where AFC is performed at the point B in the prior art but the lower limit of the capture range is extended down to −5/4τ. Therefore, even when this frequency discriminator is used in the region providing high accuracy in frequency identification, the capture range can be expanded.

The reason why the output voltage of the frequency discriminator takes on positive values in the frequency discrimination characteristic of FIG. 4C on the side of lower frequencies than the cutoff frequency $f_{HPF}$ in spite of the fact that lower frequency components of the input signal are cut off by the use of the high-pass filter will be described below. That is, when an ideal sine wave including no modulated components is input to a frequency discriminator, the output of the frequency discriminator in response to the signal whose frequency is lower than the cutoff frequency $f_{HPF}$ of a high-pass filter becomes zero, but when the signal input to the frequency discriminator is an intermediate-frequency signal including modulated components, the higher-order spectrum (side lobe) of the intermediate-frequency signal is present on the side of higher frequency than the cutoff frequency $f_{HPF}$, even if the center frequency of the intermediate-frequency signal is located on the side of lower frequency than the cutoff frequency $f_{HPF}$, and therefore a positive output voltage can be obtained for the center frequency $F_{IF}$ of the intermediate-frequency signal.

Figure 5:
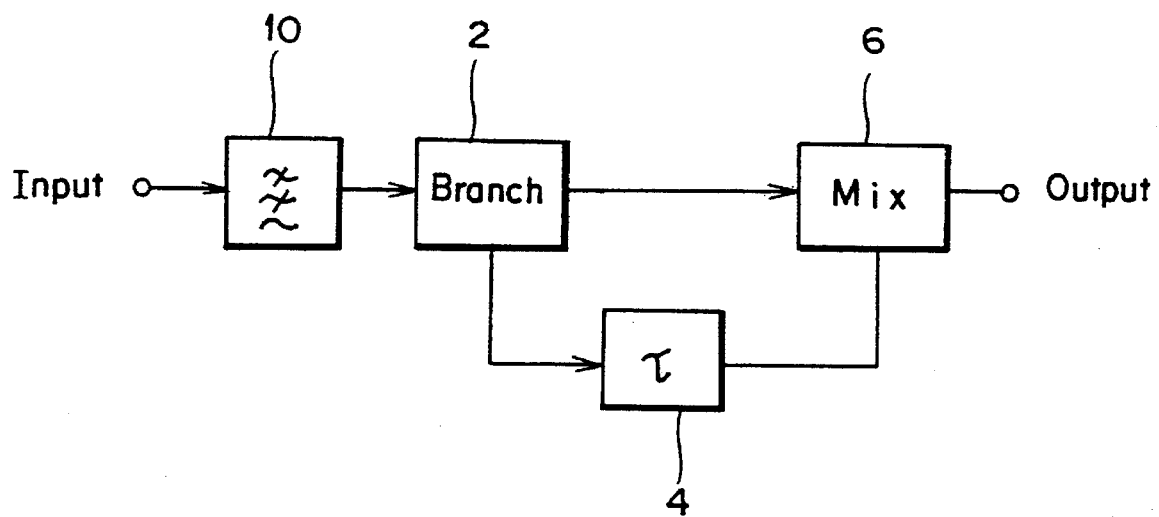
FIG. 5 is a block diagram showing a second embodiment of the frequency discriminator according to the present invention.

FIG. 5 is a block diagram showing a second embodiment of the frequency discriminator of the present invention. In this embodiment, a low-pass filter 10 having a predetermined cutoff frequency $f_{LPF}$ is provided in place of the high-pass filter 8 in the first embodiment shown in FIG. 3.

Figure 6A:
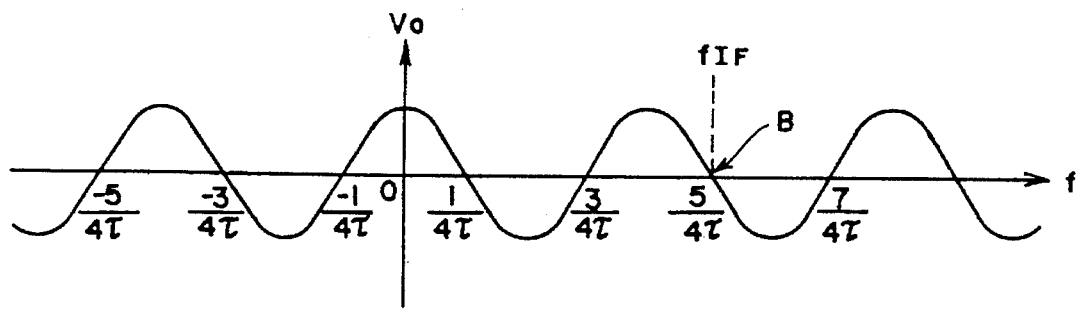
FIG. 6A, FIG. 6B, and FIG. 6C are drawings explanatory of characteristics of the frequency discriminator shown in FIG. 5.
Figure 6B:
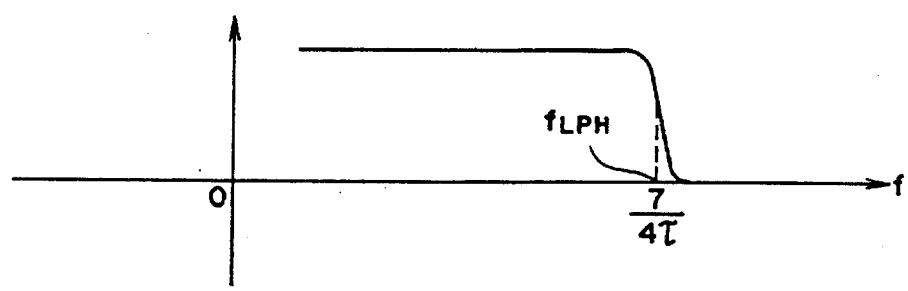
Figure 6C:
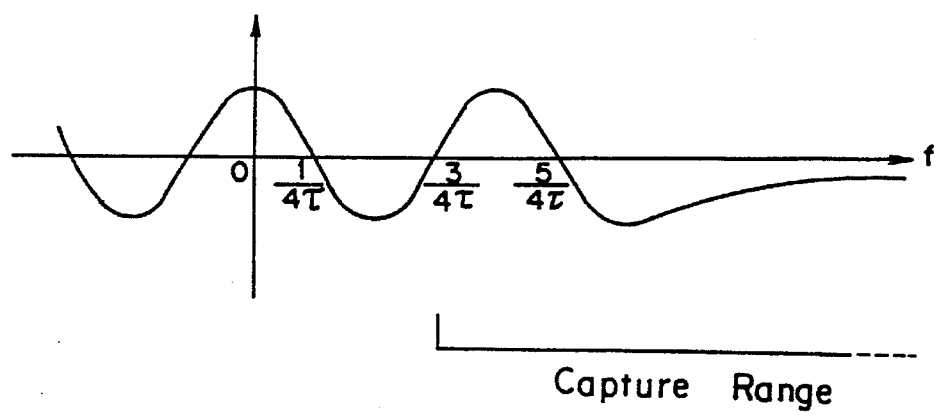

FIG. 6A, FIG. 6B, and FIG. 6C correspond to FIG. 4A, FIG. 4B, and FIG. 4C, respectively. When the center frequency $f_{IF}$ of the intermediate-frequency signal and delay time τ are set up to satisfy the expression (2), the cutoff frequency $f_{LPF}$ of the low-pass filter 10 is set up such that $$f_{LPF}=(2n+3)/4\tau. \qquad (4)$$

When n in the expression (2) is set such that n=2 and AFC is performed such that the center frequency $f_{IF}$ of the intermediate-frequency signal is stabilized at the point B of the frequency discrimination characteristic, the cutoff frequency $f_{LPF}$ of the low-pass filter 10 becomes 7/4τ.

In this case, the lower limit of the capture range is 3/4τ the same as in the prior art, but the upper limit of the capture range disappears theoretically and, hence, the capture range is expanded as compared with that in the prior art. Further, since the variation in the output voltage of the frequency discriminator for a unit of change in the frequency at the point B of the frequency discrimination characteristic becomes greater, higher accuracy in frequency identification can be obtained.

Figure 7:
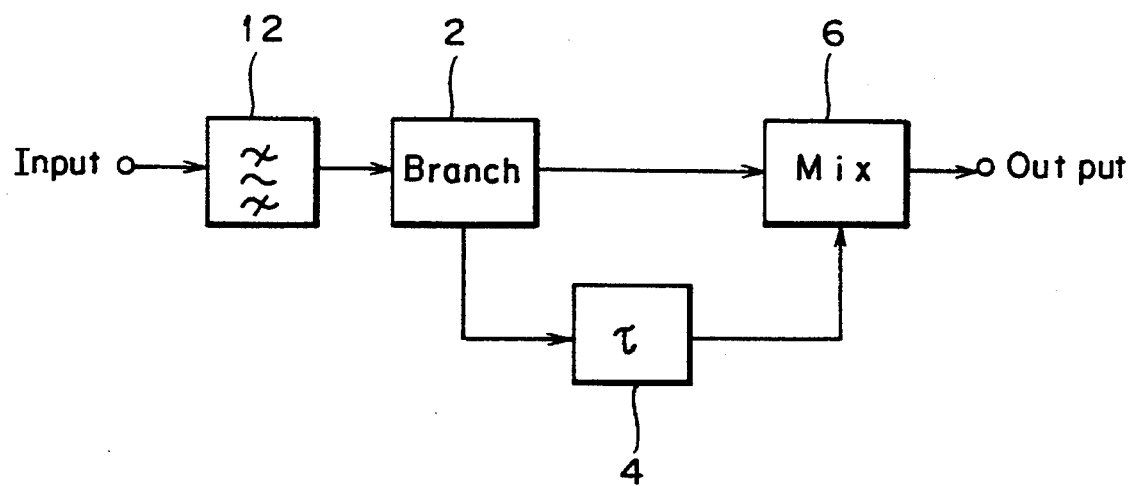
FIG. 7 is a block diagram showing a third embodiment of the frequency discriminator according to the present invention.

FIG. 7 is a block diagram showing a third embodiment of the frequency discriminator of the present invention. In the present embodiment, there is provided a bandpass filter 12 having a cutoff frequency on the high frequency side $f_H$ and a cutoff frequency on the low frequency side $f_L$ in place of high-pass filter 8 in the first embodiment of FIG. 3. Accordingly, the arrangement of the present embodiment has both the characteristics of the first embodiment of FIG. 3 and the second embodiment of FIG. 5.

Figure 8A:
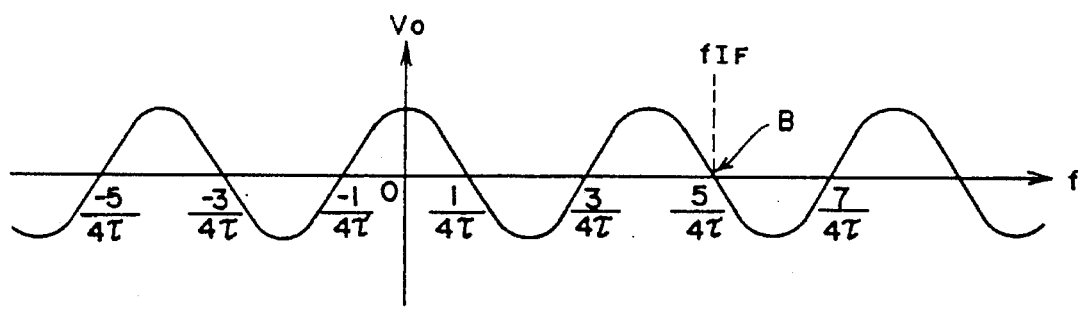
FIG. 8A, FIG. 8B, and FIG. 8C are drawings explanatory of characteristics of the frequency discriminator shown in FIG. 7.
Figure 8B:
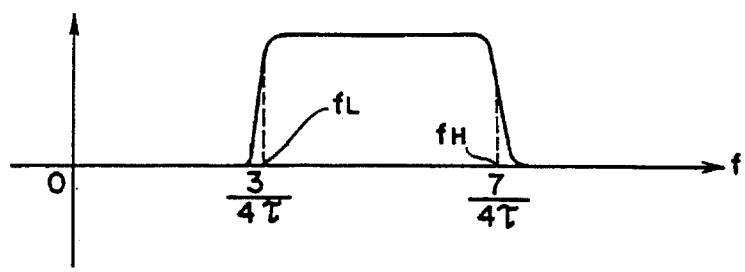
Figure 8C:
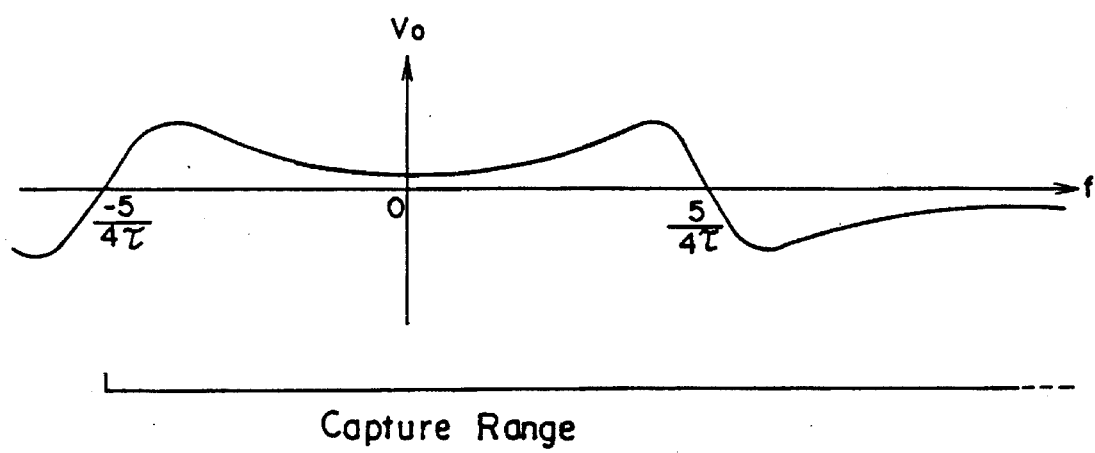

FIG. 8A, FIG. 8B, and FIG. 8C correspond to FIG. 4A, FIG. 4B, and FIG. 4C, respectively. When the center frequency $f_{IF}$ of the intermediate-frequency signal and delay time τ are set up to satisfy the expression (2), the cutoff frequency on the high frequency side $f_H$ and cutoff frequency on the low frequency side $f_L$ are set up such that $$f_H=(2n+3)/4\tau \qquad (5)$$

$$f_L=(2n-1)/4\tau \qquad (6)$$

respectively. When, for example, n is set such that n=2 and AFC is performed such that the center frequency $f_{IF}$ of the intermediate-frequency signal is stabilized at the point B, $f_H$ and $f_L$ become such that $f_H=7/4\tau$, $f_L=3/4\tau$.

In this case, as shown in FIG. 8C, while the lower limit of the capture range is −5/4τ, the upper limit of the capture range disappears theoretically and, hence, the capture range is greatly widen. Further, the accuracy in frequency identification becomes higher at the point B.

Functioning of the third embodiment of FIG. 7 was actually verified using a bandpass filter of a Tchebyshev type. The cutoff frequency on the low frequency side $f_L$ of the bandpass filter was 3 GHz and the cutoff frequency on the high frequency side $f_H$ was 7 GHz. The delay time $\tau$ in the delay circuit 4 was set to 250 psec.

Figure 9A:
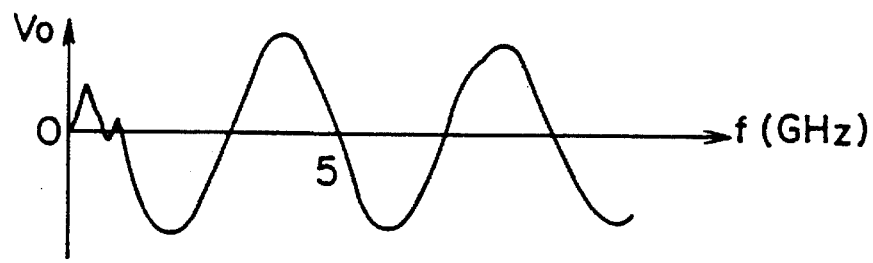
FIG. 9A and FIG. 9C are drawings showing actually measured values of characteristics of the frequency discriminator of FIG. 1 and FIG. 7, respectively, when a sine wave signal is input thereto.
Figure 9B:
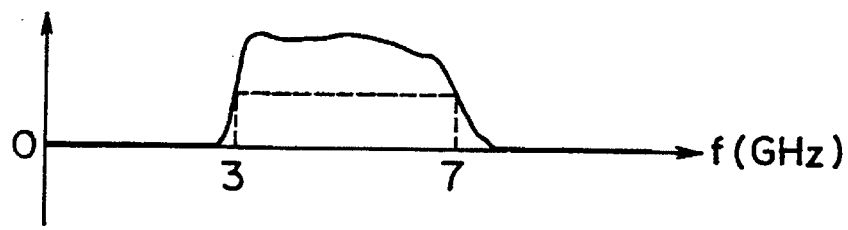
FIG. 9B is a drawing showing actually measured value of the characteristic of a bandpass filter.
Figure 9C:
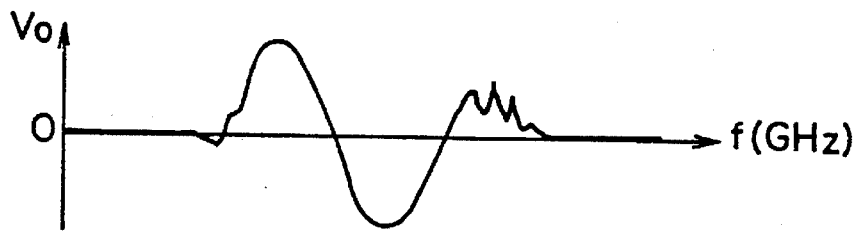

First, actually measured data of characteristics when sine waves, not modulated intermediate-frequency signals, were input are shown in FIG. 9A, FIG. 9B, and FIG. 9C. FIG. 9A shows the frequency discrimination characteristic when the bandpass filter was not used (corresponding to the prior art) and this corresponds to FIG. 8A. FIG. 9B shows the frequency characteristic of the bandpass filter and this corresponds to FIG. 8B. FIG. 9C shows the frequency discrimination characteristic in the arrangement with the bandpass filter inserted and this corresponds to FIG. 8C. That the output voltage of the frequency discriminator takes on small positive values in the frequency region higher than the cutoff frequency on the high frequency side $f_H$ in the frequency discrimination characteristic of FIG. 9C is considered due to the fact that the cutoff characteristic of the bandpass filter used was broad.

Figure 10:
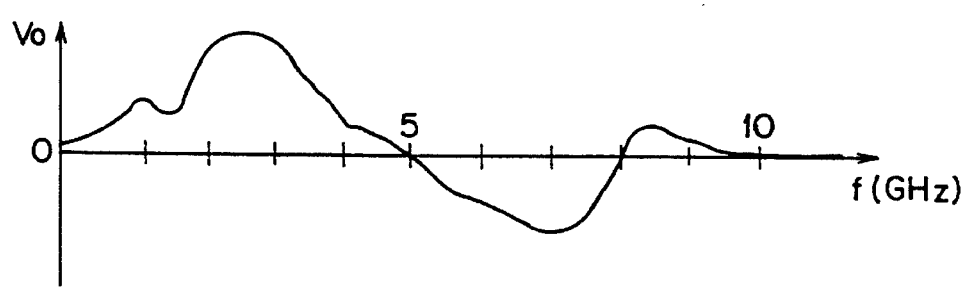
FIG. 10 is a drawing showing actually measured values of a frequency discrimination characteristic of the frequency discriminator of FIG. 7 when an intermediate-frequency signal with modulated components is input thereto.

Actually measured data of frequency discrimination characteristic obtained when a modulated intermediate-frequency signal obtained by heterodyne detection was input to this frequency discriminator is shown in FIG. 10. The intermediate-frequency signal was obtained through heterodyne detection by having a signal light beam emitted from a laser diode, which is frequency modulated, phase modulated, or amplitude modulated, mixed with a local light beam from another laser diode. The bit rate in the modulated signal was 2.5 Gbit/sec and the center frequency of the intermediate-frequency signal was 5 GHz. According to the results of the experiment, although the output voltage of the frequency discriminator is taking on positive values in the frequency region higher than the cutoff frequency on the high frequency side $f_H$ due to unexcellent cutoff characteristic of the bandpass filter, it is apparent that the capture range is expanded on the low frequency side.

Figure 11:
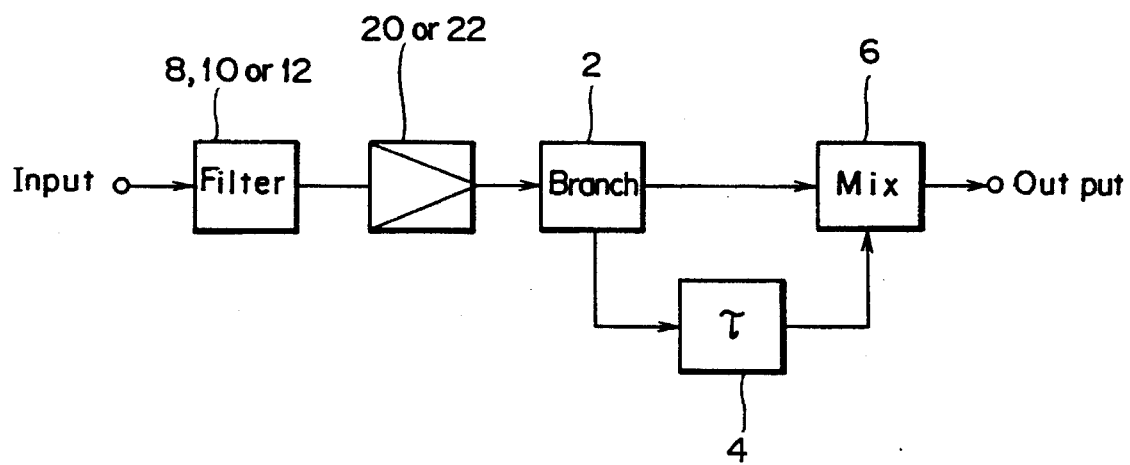
FIG. 11 is a block diagram showing an improved example of the frequency discriminator of FIG. 7.
Figure 12:
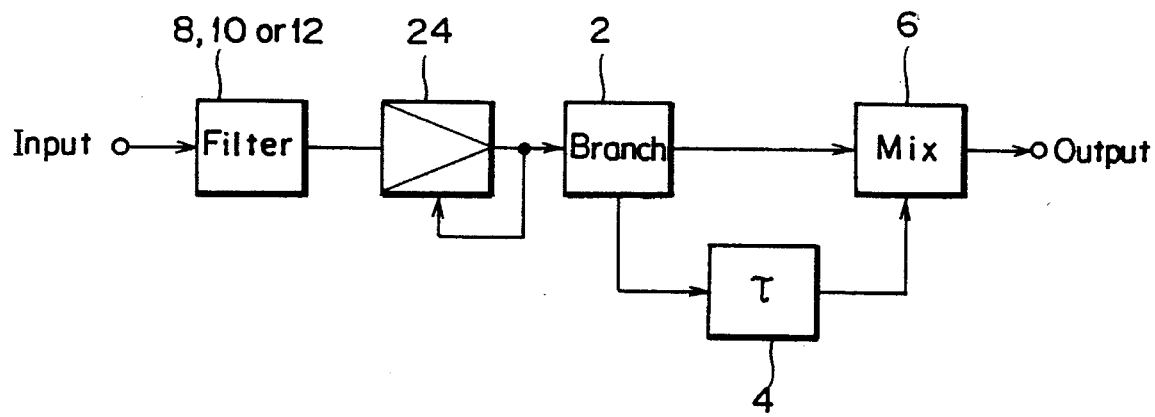
FIG. 12 is a block diagram showing another improved example of the frequency discriminator of FIG. 7.
Figure 13:
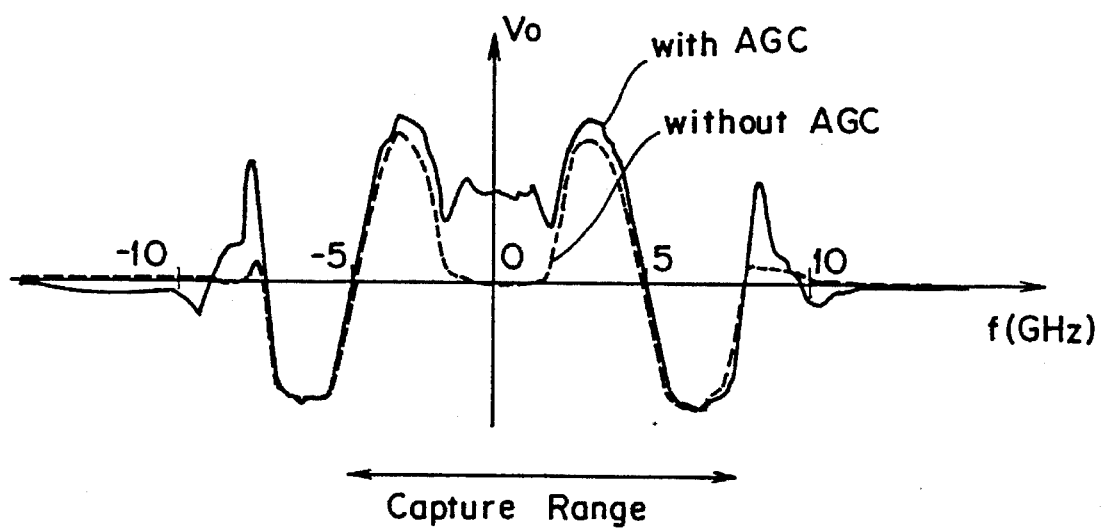
FIG. 13 is a graph for comparison of measured frequency discrimination characteristics of the frequency discriminator of FIG. 12 when an AGC circuit is operated and not operated.

In the above described embodiments, even when the center frequency of the intermediate-frequency signal is greatly apart from the passband of the filter (high-pass filter 8, low-pass filter 10, or bandpass filter 12), AFC can be performed theoretically provided that the center frequency is present within the capture range. However, when the integration of power of the high-order spectrum of the intermediate-frequency signal within the passband of the filter is small, it is possible that the polarity of the output voltage of the frequency discriminator is erroneously detected and the normal AFC operation is impaired. In order to eliminate such possibility, an embodiment as shown in FIG. 11 or FIG. 12 is proposed. In FIG. 11, there is provided a limiter circuit 20 or a gain saturation amplifier 22 between the high-pass filter 8, low-pass filter 10, or bandpass filter 12 and the branch circuit 2. In the limiter 20, the output amplitude is limited for the input amplitude larger than a predetermined value, and in the gain saturation amplifier 22, the output power is limited for the input power larger than a predetermined value. By such embodiment, even when the center frequency of the intermediate-frequency signal is apart from the passband of the filter, the power of the harmonic components of the intermediate-frequency signal is compensated so that the erroneous detection of the polarity of the output voltage of the frequency discriminator is prevented. Consequently, an effective expansion of the capture range can be attained.

An automatic gain control (AGC) circuit 24 may be provided, instead of the limiter or gain saturation amplifier, between the high-pass filter 8, low-pass filter 10, or bandpass filter 12 and the branch circuit 2 as shown in FIG. 12. The gain in the AGC circuit 24 is controlled such that the power of the signal input to the branch circuit 2 becomes constant. Also by this embodiment, an effective expansion of the capture range can be attained.

While, in the embodiment shown in FIG. 11 or FIG. 12, there is provided only one of the limiter 20, gain saturation amplifier 22, and AGC circuit 24, a combination of two or three of them connected in series may be used, instead.

FIG. 18 is a graph for comparison of actually measured data of frequency discrimination characteristics between the cases with the AGC circuit provided and not provided. The solid line indicates the frequency discrimination characteristic in the case where the AGC circuit is provided and the broken line indicates the frequency discrimination characteristic in the case where the AGC circuit is not provided. It is apparent from the graph that the positive output of the frequency discriminator is increased in the region around the point where the intermediate frequency becomes zero by the compensation for the harmonic components in the intermediate-frequency signal made by the AGC circuit.

Figure 14:
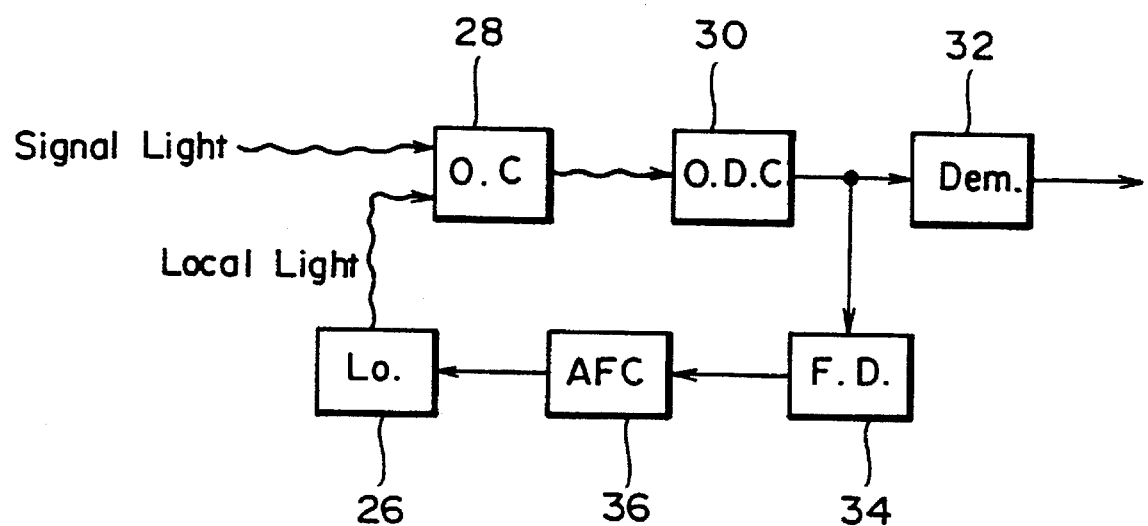
FIG. 14 is a block diagram of a heterodyne receiver for coherent lightwave communications with the frequency discriminator of the present invention applied thereto.

FIG. 14 is a block diagram of a heterodyne receiver for coherent lightwave communications to which the frequency discriminator of the present invention is applied. A signal light beam including modulated components transmitted over an optical transmission line is input to an optical coupler 28 together with a local light beam from a local light source 26. In the optical coupler 28, the signal light beam is mixed with the local light beam and the mixed light beam is subjected to heterodyne detection in an optical detection circuit 30 including a photodiode and the like. As a result of the heterodyne detection, an intermediate-frequency signal is output from the optical detection circuit 30. The intermediate-frequency signal is turned into a baseband signal in a demodulator 32. The intermediate-frequency signal from the optical detection circuit 30 is also input to the frequency discriminator 34 according to the present invention. The frequency discriminator 34 is arranged for example as shown in FIG. 12. An automatic frequency control (AFC) circuit 36 controls the frequency of the local light beam such that the output voltage of the frequency discriminator 34 becomes a constant value (for example zero). The frequency of the local light beam, when the local light source 26 comprises a laser diode, can be varied for example by adjusting the bias current for the laser diode.

When AFC is performed by applying the frequency discriminator of the present invention to a heterodyne receiver for coherent lightwave communications as described above, the stability of the center frequency of the intermediate-frequency signal is improved and, because of the expanded capture range, the frequency range over which AFC is achieved can be expanded.

As described in the foregoing, the provision of a frequency discriminator which has high accuracy in frequency identification and a wide capture range can be attained.

While the invention has been described with reference to particular embodiments, these embodiments are given by way of illustration only and not limitative of the present invention. The scope of the invention is defined by the appended claims and all changes and modifications as fall within the equivalence of the scope of the claims are therefore to be embraced by the invention.

What is claimed is:

1. A heterodyne receiver for coherent light wave communications comprising:

an optical coupler having a first input terminal to receive a signal light transmitted over an optical transmission line, a second input terminal, and a coupler output terminal;

a local light source having a frequency control input terminal, and having an output terminal to supply a local light having a local frequency to said second input terminal of said optical coupler;

an optical detection circuit having an input terminal optically connected with said coupler output terminal of said optical coupler to receive an outputted mixed light beam including said received signal light and said supplied local light from said optical coupler, and having an IF output terminal to generate an intermediate-frequency signal based on said received mixed light beam, said intermediate-frequency signal having a frequency corresponding to a difference between a frequency of said signal light and a frequency of said local light;

a demodulator having an input terminal operatively connected with said IF output terminal of said optical detection circuit, to receive said intermediate-frequency signal and to reproduce transmitted data from said intermediate-frequency signal generated by said optical detection circuit;

a frequency discriminator having an input terminal operatively connected with said IF output terminal of said optical detection circuit to receive said intermediate-frequency signal, and having an FD output terminal to generate an FD signal having a level which varies in accordance with a frequency of said received intermediate-frequency signal; and an automatic frequency control circuit having an input terminal operatively connected with said FD output terminal of said frequency discriminator to receive said generated FD signal, and having an output terminal operatively connected with said frequency control input terminal of said local light source to control said local frequency of said local light such that the level of said FD signal generated by said frequency discriminator is kept constant;

said frequency discriminator comprising:

a filter supplied with said received intermediate-frequency signal from said optical detection circuit, to limit a pass band of said intermediate-frequency signal using a cutoff frequency determined based on a delay time $\tau$, thereby to generate a limited intermediate-frequency signal, said filter having an output terminal to output said limited intermediate-frequency signal;

a branch circuit having an input terminal operatively connected with said output terminal of said filter to receive said limited intermediate-frequency signal, and having a first and a second output terminal each to output a divided said limited intermediate-frequency signal;

a delay circuit having an input terminal operatively connected with said first output terminal of said branch circuit to receive said limited intermediate-frequency signal, and having a delay output terminal to generate a delayed said received limited intermediate-frequency signal which is delayed by said delay time $\tau$; and a mixer having a first input terminal operatively connected with said delay output terminal of said delay circuit to receive said generated delayed limited intermediate-frequency signal, having a second input terminal operatively connected with said second output terminal of said branch circuit to receive said limited intermediate-frequency signal, and having a mixer output terminal to output said generated FD signal by mixing said received delayed limited intermediate-frequency signal and said limited intermediate-frequency signal.

2. A heterodyne receiver according to claim 1, wherein said delay circuit satisfies the condition given by $$f_{IF}=(2n+1)/4\tau \text{ (n: natural number)},$$

where $f_{IF}$ is the center frequency of said intermediate-frequency signal.

3. A heterodyne receiver according to claim 2, wherein said filter is a high-pass filter, and the cutoff frequency of said high-pass filter, denoted by $f_{HPF}$, satisfies the condition given by $$f_{HPF}=(2n-1)/4\tau.$$

4. A heterodyne receiver according to claim 2, wherein said filter is a low-pass filter, and the cutoff frequency of said low-pass filter, denoted by $f_{LPF}$, satisfies the condition given by $$f_{LPF}=(2n+3)/4\tau.$$

5. A heterodyne receiver according to claim 2, wherein said filter is a bandpass filter, and the cutoff frequency on a high frequency side and the cutoff frequency on a low frequency side of said bandpass filter, denoted by $f_H$ and $f_L$, respectively, satisfy the conditions given by $$f_H=(2n+3)/4\tau,$$

$$f_L=(2n-1)/4\tau.$$

6. A heterodyne receiver according to claim 1, wherein said frequency discriminator further comprises a limiter circuit operatively connected between said filter and said branch circuit.

7. A heterodyne receiver according to claim 1, wherein said frequency discriminator further comprises a gain saturation amplifier operatively connected between said filter and said branch circuit.

8. A heterodyne receiver according to claim 1, wherein said frequency discriminator further comprises an automatic gain control circuit operatively connected between said filter and said branch circuit.

9. A heterodyne receiver according to claim 1, wherein said frequency discriminator further comprises at least two circuits from the group of: a limiter circuit, a gain saturation amplifier, and an automatic gain control circuit, the group of circuits operatively connected between said filter and said branch circuit.

10. A frequency discriminator comprising:

a filter supplied with an intermediate-frequency signal to limit a pass band of said intermediate-frequency signal using a cutoff frequency determined based on a delay time $\tau$ and thereby to generate a limited intermediate-frequency signal;

a branch circuit having an input terminal operatively connected with an output terminal of said filter to receive said limited intermediate-frequency signal, and having a first and a second output terminal each to output a divided said limited intermediate-frequency signal;

a delay circuit having an input terminal operatively connected with said first output terminal of said branch circuit to receive said limited intermediate-frequency signal, and having a delay output terminal to generate a delayed said received limited intermediate-frequency signal which is delayed by said delay time $\tau$; and a mixer having a first input terminal operatively connected with said delay output terminal of said delay circuit to receive said generated delayed limited intermediate-frequency signal, having a second input terminal operatively connected with said second output terminal of said branch circuit to receive said limited intermediate-frequency signal, and having a mixer output terminal to output an FD signal by mixing said received delayed limited intermediate-frequency signal and said limited intermediate-frequency signal.

11. A frequency discriminator according to claim 10, wherein said delay circuit satisfies the condition given by $$f_{IF}=(2n+1)/4\tau \text{ (n: natural number)},$$

where $f_{IF}$ is the center frequency of said intermediate-frequency signal.

12. A frequency discriminator according to claim 11, wherein said filter is a high-pass filter, and the cutoff frequency of said high-pass filter, denoted by $f_{HPF}$, satisfies the condition given by $$f_{HPF}=(2n-1)/4\tau.$$

13. A frequency discriminator according to claim 11, wherein said filter is a low-pass filter, and the cutoff frequency of said low-pass filter, denoted by $f_{LPF}$, satisfies the condition given by $$f_{LPF}=(2n+3)/4\tau.$$

14. A frequency discriminator according to claim 11, wherein said filter is a bandpass filter, and the cutoff frequency on a high frequency side and the cutoff frequency on a low frequency side of said bandpass filter, denoted by $f_H$ and $f_L$, respectively, satisfy the conditions given by $$f_H=(2n+3)/4\tau,$$

$$f_L=(2n-1)/4\tau.$$

* * * * *